United States Patent
Lamesch

(10) Patent No.: US 10,399,526 B2
(45) Date of Patent: Sep. 3, 2019

(54) CAPACITIVE SENSOR DEVICE WITH EMI-ROBUST CAPACITIVE MEASUREMENT CIRCUIT

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/072,480

(22) PCT Filed: Jan. 25, 2017

(86) PCT No.: PCT/EP2017/051567
§ 371 (c)(1),
(2) Date: Jul. 24, 2018

(87) PCT Pub. No.: WO2017/129629
PCT Pub. Date: Aug. 3, 2017

(65) Prior Publication Data
US 2018/0370473 A1     Dec. 27, 2018

(30) Foreign Application Priority Data

Jan. 26, 2016    (LU) .......................... 92961

(51) Int. Cl.
*G01R 27/26*   (2006.01)
*B60R 21/015*   (2006.01)
(Continued)

(52) U.S. Cl.
CPC ........ *B60R 21/0154* (2014.10); *B60N 2/5685* (2013.01); *B60R 21/01532* (2014.10);
(Continued)

(58) Field of Classification Search
USPC ................................................ 324/658–690
See application file for complete search history.

(56) References Cited

U.S. PATENT DOCUMENTS

| 9,000,331 B2 | 4/2015 | Virnich et al. |
| 2007/0129043 A1 | 6/2007 | Vieira et al. |
| (Continued) | | |

FOREIGN PATENT DOCUMENTS

| JP | 2004273490 A | 9/2004 |
| LU | 91872 A1 | 3/2013 |
| (Continued) | | |

OTHER PUBLICATIONS

International Search Report on International application No. PCT/EP2017/051567, dated Jan. 25, 2017, 5 pages.
(Continued)

*Primary Examiner* — Vincent Q Nguyen
(74) *Attorney, Agent, or Firm* — Reising Ethington P.C.

(57) ABSTRACT

A capacitive sensor device configured for being connected between an electric heating member and a heating current supply and for using the electric heating member as an antenna electrode. The sensor device includes a common mode choke for connecting between the heating member and the current supply, and a control and evaluation circuit for determining an electrical impedance between the electric heating member and a counter electrode via a measurement node. The control and evaluation circuit includes: a third winding inductively coupled to the first and second windings of the common mode choke, a periodic signal voltage source directly connected to the third common mode choke winding, an electrical quantity measurement circuit configured to determine an electrical quantity across the measurement node, and an EMI filter network that is connected across a
(Continued)

signal input port of the third winding and a reference input port connected to AC ground potential.

13 Claims, 3 Drawing Sheets

(51) Int. Cl.
| | | |
|---|---|---|
| *B60N 2/56* | (2006.01) | |
| *B62D 1/06* | (2006.01) | |
| *H03K 17/955* | (2006.01) | |
| *B62D 1/04* | (2006.01) | |
| *H03K 17/96* | (2006.01) | |

(52) U.S. Cl.
CPC ............ *B62D 1/046* (2013.01); *B62D 1/065* (2013.01); *H03K 17/955* (2013.01); *B60Q 2300/122* (2013.01); *H03K 2017/9602* (2013.01); *H03K 2217/960705* (2013.01); *H03K 2217/960735* (2013.01)

(56) References Cited

U.S. PATENT DOCUMENTS

| | | |
|---|---|---|
| 2011/0148648 A1 | 6/2011 | Fischer et al. |
| 2015/0345998 A1* | 12/2015 | Lamesch .............. B60N 2/5685 324/686 |

FOREIGN PATENT DOCUMENTS

| | | |
|---|---|---|
| WO | WO2014096127 A1 | 6/2014 |
| WO | WO2014166780 A1 | 10/2014 |

OTHER PUBLICATIONS

Written Opinion on International application No. PCT/EP2017/051567, dated Jan. 25, 2017, 6 pages.

Smith, J.R., Electric Field Sensing for Graphical Interfaces, IEEE Computer Graph. Appl., vol. 18, No. 3, May/Jun. 1998. pp. 54-60.

* cited by examiner

Prior Art

CAPACITIVE SENSOR DEVICE WITH EMI-ROBUST CAPACITIVE MEASUREMENT CIRCUIT

TECHNICAL FIELD

The present invention generally relates to capacitive sensing, e.g. for detecting the presence or absence of a person on a seat (seat occupancy detection) or the presence or absence of a person's hand on the steering wheel of a car (hands-off or hands-on detection).

More specifically, the present invention relates to a capacitive sensor device using a heating member as an antenna electrode, and a seat occupancy detection system for detecting an occupancy of the seat, in particular a vehicle seat, comprising such capacitive sensor device.

BACKGROUND OF THE INVENTION

Capacitive sensors and capacitive measurement and/or detection systems employing capacitive sensors have a wide range of applications, and are among others used for the detection of the presence and/or the position of a conductive body in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998. The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may e.g. be determined by applying an alternating voltage signal to an antenna electrode and by measuring the current flowing from that antenna electrode either towards ground (in the loading mode) or into a second antenna electrode (in coupling mode). This current may be measured by a transimpedance amplifier, which is connected to the sensing electrode and which converts the current flowing into the sensing electrode into a voltage proportional to the current.

Capacitive sensors, which use a heating member as antenna electrode are known in the patent literature. By way of example, US 2011/0148648 A1 discloses a capacitive occupant sensing system for a vehicle seat, using a seat heating member 12 as antenna electrode. FIG. 1 schematically shows an illustration of this prior art. Voltage source 2 represents the power supply for the heater, for example a seat heater control unit. Electronic control module (ECM) 1 is configured as a capacitive measurement circuit. It comprises a common mode choke 5, an AC voltage source 9 and capacitors 6, 7 and 8. Capacitor 8 couples the AC voltage generated by AC voltage source 9 into the node 11. The heating member 12 is represented by complex impedance 13 towards ground. The complex impedance 13 includes a capacitive component as well as a resistive component, which depend on the occupancy state of the vehicle seat. Complex impedance 13 is thus hereinafter also referred to as "unknown impedance" or "impedance to be determined". The capacitor 8 forms together with the unknown impedance 13 a voltage divider. The complex voltage $U_{meas}$ between node 11 and circuit ground 10 can be used to calculate the unknown complex impedance 13. The common mode choke 5 decouples the AC voltage on node 11 from AC ground due to its large impedance. The heating member 12 may at the same time be traversed by the DC current supplied by voltage source 2 and driven with the AC voltage by the capacitive measurement circuit. Capacitors 6 and 7 ensure that a defined AC ground is present on the side of the common mode choke 5 that is connected to the DC power supply of the seat heater. Ground 3 is the reference ground. The connections of the common mode coke 5 are numbered 5.1 through 5.4: connection 5.1 connects the first winding to the high potential side of the voltage source 2; connection 5.2 connects the first winding to the high potential side of the heating member 12; connection 5.3 connects the second winding to the low potential side of the heating member 12 and connection 5.4 connects the second winding to the low potential side of the voltage source 2.

Resistor 4 represents the wiring resistance of the wiring between the low potential side of voltage source 2 and the fourth connection 5.4 of common mode choke 5. There is a similar wiring resistance for the upper wiring between the high potential side of voltage source 2 and common mode choke 5, but this can be neglected for the explanation that follows. Typically, the voltage source 2, which represents the seat heater control unit, is switched on and off periodically to control the heating power of seat heater 12 according to a pulse-width-modulation scheme. A typical switching frequency would, for instance, be 25 Hz. Each time voltage source 2 is switched on, the current through wiring resistance 4 rises from substantially 0 A to the operating current of the seat heater, which is, for example, for a voltage source 2 voltage of 12 V, a seat heater resistance of 1 Ω and a wiring resistance of 0.1 Ω equal to about 10.9 A. This current of 10.9 A generates a voltage drop of 1.09 V across wiring resistance 4 each time the voltage source 2 is switched on. This implies that the voltage on the fourth connection 5.4 of the common mode choke 5 will rise to 1.09 V, and consequently also the voltage on node 11 will rise to 1.09 V. The resistance of the second winding of common mode choke 5 is neglected here, but it will also contribute to an additional voltage drop due to its finite conductance. The voltage step of 1.09 V on the sense node may disturb the measurement of the signal voltage on sense node 11, since the step function has a wide frequency bandwidth. The situation is even worse if the seat heater control unit connected to the electronic control module 1 does not interrupt the heating circuit on the high potential side but on the low potential side. This means indeed that the node 11 experiences a voltage drop of about 12 V−1.09 V=10.91 V, which is worse than the 1.09 V step mentioned above. This situation may arise if one type of electronic control module 1 for the capacitive sensing must be usable for different types of seat heater control units e.g. to comply with cost requirements.

Another challenging situation arises for capacitive measurement circuits that are intended for vehicle applications and therefore have to comply with automotive rules and standards, for instance such as ISO 11451-4 (Road vehicles—Vehicle test methods for electrical disturbances from narrowband radiated electromagnetic energy—Part 4: Bulk current injection (BCI)). When operating at a carrier frequency of >1 MHz (for instance, in the range between 4 to 6 MHz), capacitive measurement circuits are easily disturbed by injected radio frequency (RF) currents during the BCI test.

International application WO 2014/096127 A1 describes a capacitive sensor configured for connection between a heating member and a heating current supply. FIG. 2 schematically shows an illustration of this prior art.

DC voltage source 20 is configured for supplying DC current to heater 25 via common-mode choke 22. Unknown impedance 26 is measured by transimpedance amplifier 27, which is driven on its reference input by AC voltage source 24. As the voltage on output 28 of transimpedance amplifier 27 is indicative of the current into the signal input of transimpedance amplifier 27, the voltage on output 28 is also indicative of the current through the unknown impedance 26, and therefore of the unknown impedance value. Reference numeral 21 denotes the system ground. Capacitor 23 is a simple means to filter out high frequency currents injected during BCI testing, by shorting them to the output of AC voltage source 24. It is noted, however, that the output impedance of AC voltage source 24 is not zero, which implies that a portion of the injected high frequency current is not shorted to ground.

SUMMARY

It is therefore an object of the invention to provide a capacitive sensor device, in particular for being connected between an electric heating member and a heating current supply, with improved properties at least with regard to EMI-robustness, in particular regarding EMI generated during executing a BCI test protocol, while at the same time keep the benefits of employing a common-mode choke as described beforehand.

In one aspect of the present invention, the object is achieved by a capacitive sensor device that is configured for being connected between an electric heating member and a heating current supply and for using the heating member as an antenna electrode.

The capacitive sensor device comprises a common mode choke and a control and evaluation circuit.

The common mode choke has first and second inductively coupled windings. The first winding is configured for being connected between a first terminal of the heating current supply and a first terminal of the heating member. The second winding is configured for being connected between a second terminal of the heating member and a second terminal of the heating current supply.

The control and evaluation circuit is configured for injecting a periodic alternating measurement signal into the heating member via a measurement node, and is further configured to measure an electrical quantity across the measurement node and to derive, based on the measured electrical quantity, an electrical impedance between the heating member and a counter electrode.

The control and evaluation circuit includes
a third common mode choke winding that is inductively coupled to the first winding and the second winding of the common mode choke;
a periodic signal voltage source that is configured for providing an alternating measurement voltage at an output port, wherein the output port is electrically directly connected to a first terminal connection of the third common mode choke winding;
an electrical quantity measurement circuit having a signal input port and a reference input port and being configured to determine, with reference to a reference electric quantity provided to the reference input port, the electrical quantity across the measurement node, wherein the signal input port is electrically connected to a second terminal connection of the third common mode choke winding, and the reference input port is electrically connected to a ground conductor that provides an AC ground potential; and
an electromagnetic interference (EMI) filter network that is electrically connected across the signal input port and the reference input port of the electrical quantity measurement circuit.

The measurement node is operatively coupled to the third winding for inductively injecting the periodic alternating measurement signal into the heating member.

The advantage of the capacitive sensor device lies in that the EMI filter that is electrically connected across the signal input port and the reference input port of the electrical quantity measurement circuit is electrically connected directly, i.e. via a low impedance electrical path, to AC potential instead of to guard node potential. In this way, an improved suppression of RF currents injected during executing a BCI test protocol can be accomplished.

The term "being configured to", as used in this application, shall in particular be understood as being specifically programmed, laid out, furnished or arranged.

It is further noted herewith that the terms "first", "second", etc. are used in this application for distinction purposes only, and are not meant to indicate or anticipate a sequence or a priority in any way.

Preferably, the third common mode choke winding is inductively coupled in the same winding sense as the first winding and the second winding. An effort for compensating the effect of a phase reversal in the electrical quantity to be determined by the electrical quantity measurement circuit can beneficially be saved.

In some embodiments, the first winding, the second winding and the third winding of the common mode choke are arranged within a common housing. By that, a compact design can be achieved, and undesired magnetic stray fields can be kept at a low level. As a consequence, the AC signal provided to the heating member via inductive coupling will have substantially the same amplitude as the original alternating measurement voltage in the measurement node.

If 1-to-1 transformation between the third winding and each of the first and second windings is not intended, the third winding may have a number of turns that is different from a number of turns of the first winding and the second winding, respectively.

In a preferred embodiment of the capacitive sensor device, the electrical quantity measurement circuit is designed as a current measurement circuit that is configured to determine, with reference to a reference voltage, a sense current that is flowing through the third common mode choke winding and is indicative of a position of an object relative to the heating member. This embodiment is especially advantageous for operating the heating member as an antenna electrode in loading mode.

Preferably, the sense current measurement circuit comprises a transimpedance amplifier (TIA), and the signal input port and the reference input port form part of the TIA. The TIA converts a current flowing in the third winding into a voltage, which is proportional to the current. In this way, a simpler further signal processing can be facilitated.

In some embodiments of the capacitive sensor device, the electrical quantity measurement circuit is configured to measure a voltage at the measurement node and to derive the impedance between said heating member and a counter electrode on the basis of the measured voltage.

Preferably, the counter electrode is connected to ground potential.

In some embodiments of the capacitive sensor device, the first terminal of the heating current supply and the second terminal of the heating current supply are electrically AC-coupled to the ground conductor. The AC coupling to the ground conductor ensures that an AC potential at terminal connections of the first winding and the second winding of the common mode choke that are electrically connected to the heating current supply are on a defined AC potential, namely AC ground, irrespective of the precise configuration of the heating current supply. This implies that an AC voltage of the second terminal connection of the third common mode choke winding that is connected to the signal input port of the electrical quantity measurement circuit, for instance a transimpedance amplifier, is beneficially substantially zero volts AC.

In a preferred embodiment, the EMI filter network comprises at least one capacitor. By that, the signal input port and the reference input port of the electrical quantity measurement circuit can be virtually be shorted for high frequency signals that are injected during executing a BCI test protocol. The EMI filter may also contain additional inductors or ferrite beads in combination with one or more capacitors, in order to achieve a better filtering respectively attenuation of the injected BCI currents.

In another aspect of the invention, a seat occupancy detection system for detecting an occupancy of the seat, in particular a vehicle seat is provided. The seat occupancy detection system includes an embodiment of the capacitive sensor device disclosed beforehand, an electric heating member that is arranged at a cushion or a backrest forming part of the seat and that is employable as an antenna electrode, and a heating current supply for providing electric current to the electric heating member.

The advantages described in context with the capacitive sensor device in accordance with the invention also apply to the disclosed seat occupancy detection system.

In some embodiments of the seat occupancy detection system, the heating current supply is configured to provide a DC current to the electric heating member, wherein the first winding is galvanically connected between the first terminal of the heating current supply and the first terminal of the heating member, and the second winding is galvanically connected between the second terminal of the heating member and the second terminal of the heating current supply. By that, a simple design of a seat occupancy detection system as disclosed herein with a heating member that is arranged at a cushion or a backrest for heating the seat and that is employable as an antenna electrode can be accomplished.

In a further aspect of the invention, a hands-on or hands-off detection device for a steering wheel of a vehicle is provided. The hands-on or hands-off detection device includes an embodiment of the capacitive sensor device disclosed beforehand, an electric heating member that is arranged at the steering wheel and that is employable as an antenna electrode, and a heating current supply for providing electric current to the electric heating member.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 3:
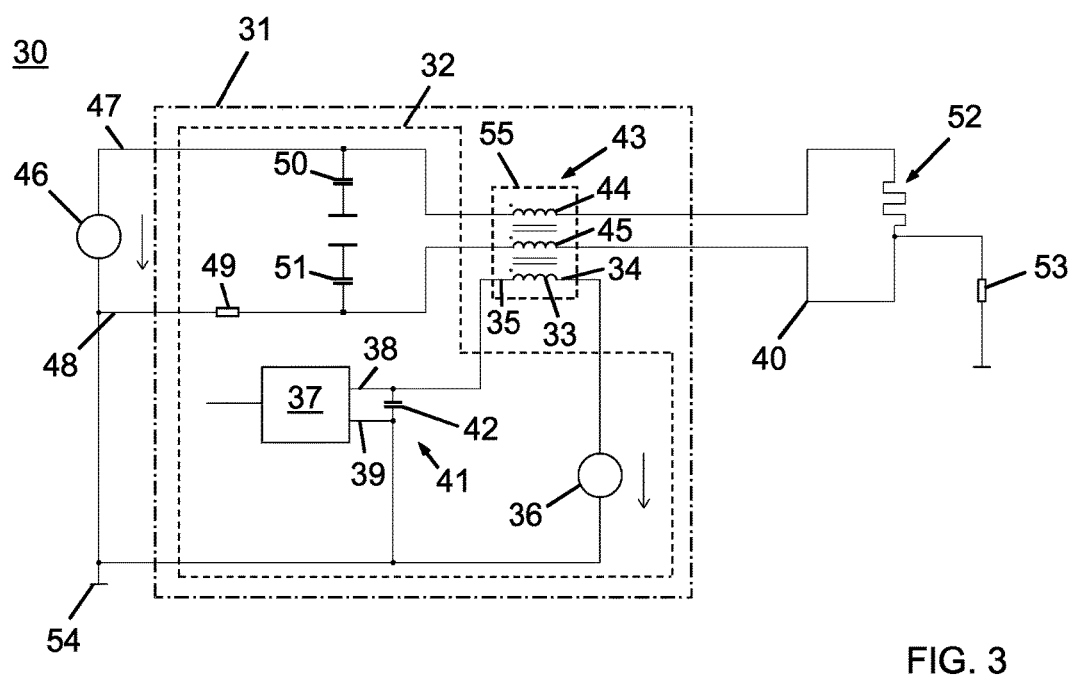
FIG. 3 illustrates a schematic circuit diagram of a seat occupancy detection system comprising a capacitive sensor device in accordance with an embodiment of the invention that uses a heating member as an antenna electrode.

FIG. 3 illustrates a schematic circuit diagram of a seat occupancy detection system 30 comprising a capacitive sensor device 31 in accordance with an embodiment of the invention.

The seat occupancy detection system 30 is configured for detecting an occupancy of the seat, in particular a vehicle seat. The seat occupancy detection system 30 includes the capacitive sensor device 31, an electric heating member 52 that is arranged at a cushion or a backrest forming part of the seat, and a heating current supply 46 for providing electric current to the electric heating member 52. More specifically, the heating current supply 46 is configured to provide a DC current to the electric heating member 52.

The capacitive sensor device 31 is configured for being connected between the electric heating member 52 and the heating current supply 46 and for using the heating member 52 as an antenna electrode. The electric heating member 52 has a complex impedance 53 towards ground. The complex impedance 53 includes a capacitive component as well as a resistive component, which depend on the occupancy state of the vehicle seat.

The capacitive sensor device 31 includes a common mode choke 43 having first and second inductively coupled windings 44, 45. The first winding 44 is galvanically connected between a first terminal 47 of the heating current supply 46 and a first terminal of the electric heating member 52. The second winding 45 is galvanically connected between a second terminal of the electric heating member 52 and a second terminal 48 of the heating current supply 46. Resistor 49 represents a wiring resistance of the wiring between the second terminal 48 of the heating current supply 46 and the second common mode choke winding 45. The first terminal of the heating current supply 47 and the second terminal 48 of the heating current supply 46 are electrically AC-coupled to a ground conductor by capacitors 50, 51 to ensure that a defined AC ground is present on the side of the common mode choke 43 that is connected to the DC heating current supply 46. Ground 54 serves as a reference ground.

Moreover, the capacitive sensor device 31 comprises a control and evaluation circuit 32 that is configured for injecting a periodic alternating measurement signal into the electric heating member 52 via a measurement node 40, to measure an electrical quantity across the measurement node 40, and to derive, from the measured electrical quantity, the complex impedance 53 between the electric heating member 52 and a counter electrode. The counter electrode is connected to the potential of reference ground 54.

To this end, the control and evaluation circuit 32 includes
a third common mode choke winding 33,
a periodic signal voltage source 36,
an electrical quantity measurement circuit 37, and
an EMI filter network 41.

Figure 1:
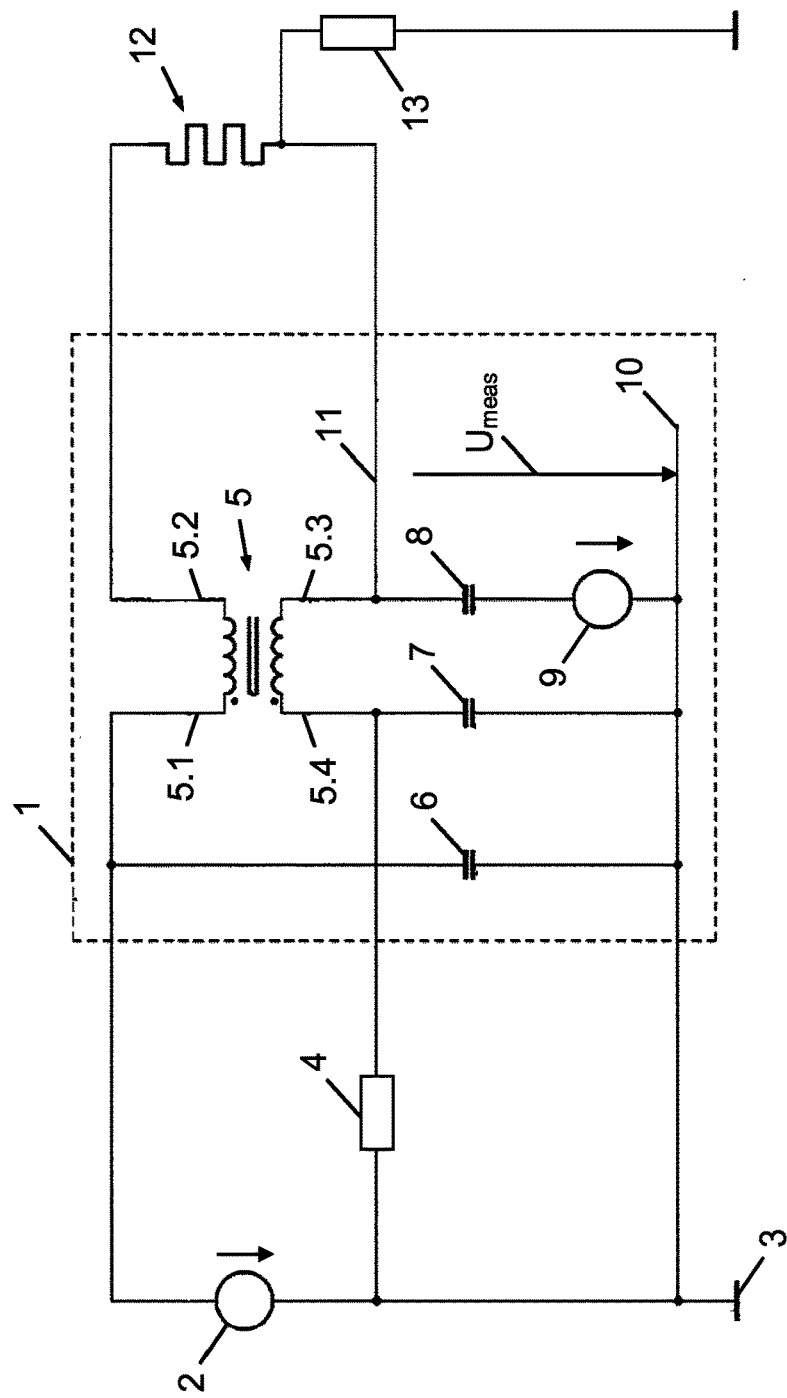
FIG. 1 illustrates a schematic circuit diagram of a first prior art capacitive sensing system, using a heating member as antenna electrode.
Figure 2:
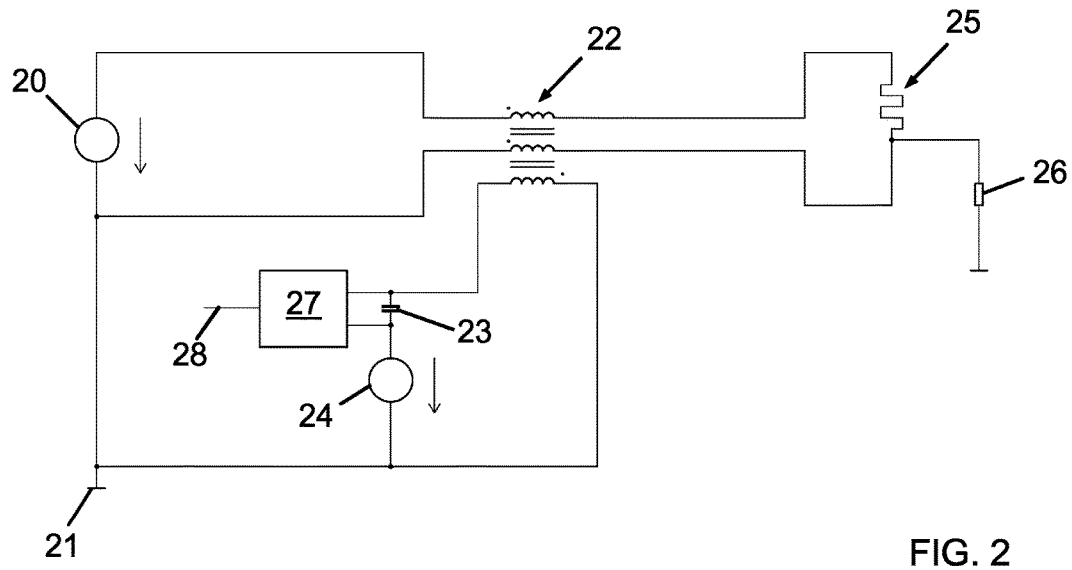
FIG. 2 illustrates a schematic circuit diagram of a second prior art capacitive sensing system for a seat, using a seat heating member as antenna electrode.

The third common mode choke winding 33 is inductively coupled to the first winding 44 and the second winding 45 of the common mode choke 43. In contrast to the embodiment of the capacitive sensing system shown in FIG. 2, connections of the third common mode choke winding 33 are exchanged such that the third common mode choke winding 33 is inductively coupled in the same winding sense as the first winding 44 and the second winding 45. In this specific embodiment, the third winding 33 has a number of turns that is equal to a number of turns of the first winding 44 and a number of turns of the second winding 45. Other embodiments with the third winding of the common mode choke having a different number of turns than the first winding and the second winding are as well contemplated. It will be noted in this context, that the first and second winding always have to have the same number of windings, else the common mode choke does not work. For a compact design and low magnetic stray fields, the first winding 44, the second winding 45 and the third winding 33 of the common mode choke 43 are arranged within a common housing 55.

The periodic signal voltage source 36 is configured for providing an alternating measurement voltage, namely of substantially sinusoidal shape, at an output port. The output port is electrically directly connected to a first terminal connection 34 of the third common mode choke winding 33.

The electrical quantity measurement circuit 37 has a signal input port 38 and a reference input port 39 and is configured to determine, with reference to a reference electric quantity provided to the reference input port 39, the electrical quantity across the measurement node 40. In this specific embodiment, the electrical quantity measurement circuit 37 is designed as a current measurement circuit comprising a transimpedance amplifier (TIA). The signal input port 38 and the reference input port 39 form part of the TIA. The current measurement circuit 37 is configured to determine, with reference to a reference voltage provided to the reference input port 39, a sense current that is flowing through the third common mode choke winding 33 and that is indicative of a position of an object relative to the electric heating member 52.

It will readily be appreciated by those skilled in the art that, alternatively, the electrical quantity measurement circuit may be configured to measure a voltage at the measurement node and to derive the impedance between the heating member and the counter electrode on the basis of the measured voltage.

The signal input port 38 of the TIA is electrically connected to a second terminal connection 35 of the third common mode choke winding 33, and the reference input port 39 is electrically connected to the ground conductor that provides AC ground potential.

The AC voltage of the second terminal connection 35 of the third common mode choke winding 33 is actually substantially zero volts AC, due to the fact that the signal input port 38 of the TIA is kept at substantially AC ground by the TIA. As the sense of the windings 44, 45 and 33 is the same for all three windings as indicated by the dots on the left top edge of each of the three windings, and as an AC voltage generated by periodic voltage source 36 is applied to the first terminal connection 35, the same AC voltage also appears at the measurement node 40, due to the transformer action of common mode choke 43 and the defined sense of the windings.

The EMI filter network 41 comprises a capacitor 42 and is electrically connected across the signal input port 38 and the reference input port 39 of the electrical quantity measurement circuit 37. The EMI filter may also contain additional inductors or ferrite beads in combination with one or more capacitors, in order to achieve a better filtering respectively attenuation of the injected BCI currents.

By that, the capacitor 42 is electrically connected via a low impedance path of substantially zero impedance to AC ground, and high frequency currents injected during executing a BCI test protocol are effectively shorted to AC ground.

Figure 4:
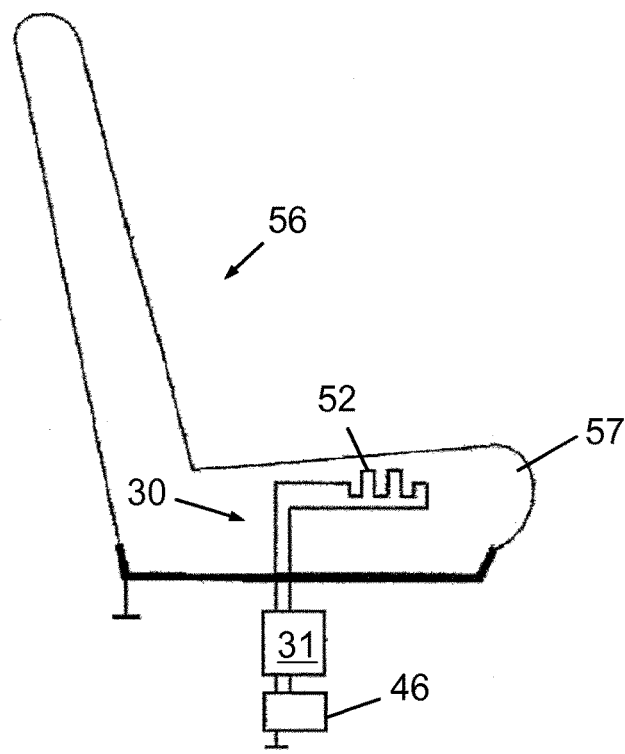
FIG. 4 schematically shows a vehicle seat equipped with the seat occupancy detection system pursuant to FIG. 3.

FIG. 4 schematically shows a vehicle seat 56 equipped with the seat occupancy detection system 30 comprising the capacitive sensor device 31, the heating current supply 46 and the electric heating member 52 being installed in a seat cushion of the vehicle seat 56.

Figure 5:
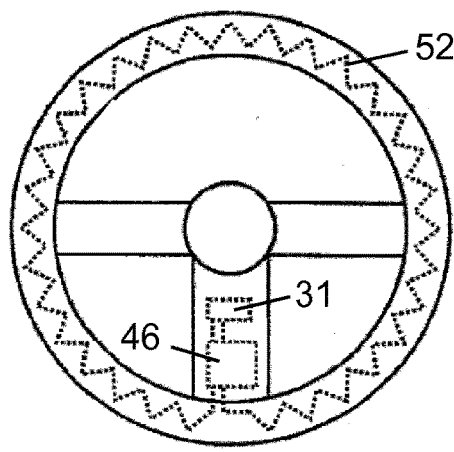
FIG. 5 schematically shows a steering wheel with an installed capacitive hands-on or hands-off sensing system equipped with the capacitive sensor device pursuant to FIG. 3.

FIG. 5 schematically shows a steering wheel 58 with an installed capacitive hands-on or hands-off sensing system equipped with the capacitive sensor device 31, the heating current supply 46 and the electric heating member 52.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive sensor device, configured for being connected between an electric heating member and a heating current supply and for using the electric heating member as an antenna electrode, comprising:

a common mode choke having first and second inductively coupled windings, wherein the first winding is configured for being connected between a first terminal of the heating current supply and a first terminal of the electric heating member, and wherein the second winding is configured for being connected between a second terminal of the electric heating member and a second terminal of the heating current supply; and a control and evaluation circuit that is configured for injecting a periodic alternating measurement signal into the electric heating member via a measurement node, to measure an electrical quantity across the measurement node, and to derive, based on the measured electrical quantity, an electrical impedance between the electric heating member and a counter electrode;

the control and evaluation circuit including:
- a third common mode choke winding inductively coupled to the first winding and the second winding of the common mode choke;
- a periodic signal voltage source that is configured for providing an alternating measurement voltage at an output port, wherein the output port is electrically directly connected to a first terminal connection of the third common mode choke winding;
- an electrical quantity measurement circuit having a signal input port and a reference input port and being configured to determine, with reference to a reference electric quantity provided to the reference input port, the electrical quantity across the measurement node, wherein the signal input port is electrically connected to a second terminal connection of the third common mode choke winding, and the reference input port is electrically connected to a ground conductor that provides an AC ground potential; and
- an EMI filter network that is electrically connected across the signal input port and the reference input port of the electrical quantity measurement circuit.

2. The capacitive sensor device as claimed in claim 1, wherein the third common mode choke winding is inductively coupled in the same winding sense as the first winding and the second winding.

3. The capacitive sensor device as claimed in claim 1, wherein the first winding and the second winding of the common mode choke and the third common mode choke winding are arranged within a common housing.

4. The capacitive sensor device as claimed in claim 1, wherein the third winding has a number of turns that is equal to a number of turns of the first winding and the second winding.

5. The capacitive sensor device as claimed in claim 1, wherein the third winding has a number of turns that is different to a number of turns of the first winding and the second winding.

6. The capacitive sensor device as claimed in claim 1, wherein the electrical quantity measurement circuit is designed as a current measurement circuit that is configured to determine, with reference to a reference voltage, a sense current that is flowing through the third common mode choke winding and is indicative of a position of an object relative to the electric heating member.

7. The capacitive sensor device as claimed in claim 6, wherein the sense current measurement circuit comprises a transimpedance amplifier, and the signal input port and the reference input port form part of the transimpedance amplifier.

8. The capacitive sensor device as claimed in claim 1, wherein the electrical quantity measurement circuit is configured to measure a voltage at the measurement node and to derive the impedance between the electric heating member and the counter electrode on the basis of the measured voltage.

9. The capacitive sensor device as claimed in claim 1, wherein the first terminal of the heating current supply and the second terminal of the heating current supply are electrically AC-coupled to the ground conductor.

10. The capacitive sensor device as claimed in claim 1, wherein the EMI filter network comprises at least one capacitor.

11. A seat occupancy detection system for detecting an occupancy of a seat, in particular a vehicle seat, the seat occupancy detection system comprising:
- a capacitive sensor device as claimed in claim 1,
- an electric heating member that is arranged at a cushion or a backrest forming part of the seat and that is employable as an antenna electrode, and
- a heating current supply for providing electric current to the electric heating member.

12. The seat occupancy detection system as claimed in claim 11, wherein the heating current supply is configured to provide a DC current to the electric heating member, wherein the first winding is galvanically connected between the first terminal of the heating current supply and the first terminal of the electric heating member, and the second winding is galvanically connected between the second terminal of the electric heating member and the second terminal of the heating current supply.

13. A hands-on or hands-off detection device for a steering wheel, comprising:
- a capacitive sensor device as claimed in claim 1,
- an electric heating member that is arranged at the steering wheel and that is employable as an antenna electrode, and
- a heating current supply for providing electric current to the electric heating member.

* * * * *